(12) United States Patent
Ko et al.

(10) Patent No.: US 10,742,112 B2
(45) Date of Patent: Aug. 11, 2020

(54) DRIVING CIRCUIT AND SWITCH SIGNAL GENERATION METHOD THEREOF

(71) Applicant: uPI semiconductor corp., Zhubei, Hsinchu County (TW)

(72) Inventors: Sheng-An Ko, Zhubei (TW); Bo-Zhou Ke, Zhubei (TW)

(73) Assignee: UPI SEMICONDUCTOR CORP., Zhubei, Hsinchu County (TW)

( * ) Notice: Subject to any disclaimer, the term of this patent is extended or adjusted under 35 U.S.C. 154(b) by 0 days.

(21) Appl. No.: 16/656,818

(22) Filed: Oct. 18, 2019

(65) Prior Publication Data
US 2020/0153328 A1  May 14, 2020

(30) Foreign Application Priority Data
Nov. 8, 2018 (CN) .......................... 2018 1 1324805

(51) Int. Cl.
| | | |
|---|---|---|
| *H02M 1/38* | (2007.01) | |
| *H02M 1/08* | (2006.01) | |
| *H03K 19/20* | (2006.01) | |

(52) U.S. Cl.
CPC ............... *H02M 1/38* (2013.01); *H02M 1/08* (2013.01); *H03K 19/20* (2013.01)

(58) Field of Classification Search
CPC .................................. H02M 1/38; H02M 1/08
USPC .... 327/108–112, 427, 434, 437; 326/82, 83, 326/87
See application file for complete search history.

(56) References Cited

U.S. PATENT DOCUMENTS

| | | |
|---|---|---|
| 7,456,620 B2 | 11/2008 | Maksimovic et al. |
| 8,063,616 B2 | 11/2011 | Bahramian et al. |
| 8,436,594 B2 | 5/2013 | Fu et al. |
| 10,044,347 B2 | 8/2018 | Abesingha et al. |
| 2014/0203861 A1* | 7/2014 | Chen .................... H03K 17/284 327/399 |

\* cited by examiner

*Primary Examiner* — Tomi Skibinski
(74) *Attorney, Agent, or Firm* — McClure, Qualey & Rodack, LLP

(57) ABSTRACT

A driving circuit and a switch signal generation method are provided. The driving circuit receives a PWM signal and provides a first switch signal and a second switch signal. The driving circuit includes a logical signal circuit, a lower bridge dead time circuit and a lower bridge driving circuit. The logical signal circuit provides a first logical signal and a second logical signal according to the PWM signal. The lower bridge dead time circuit determines a leading edge of a lower bridge dead time signal according to the first logical signal and determines a trailing edge of lower bridge dead time signal according to a trailing edge of first switch signal. The lower bridge driving circuit determines a leading edge of second switch signal according to second logical signal and determines a trailing edge of second switch signal according to the trailing edge of lower bridge dead time signal.

9 Claims, 6 Drawing Sheets

DRIVING CIRCUIT AND SWITCH SIGNAL GENERATION METHOD THEREOF

BACKGROUND OF THE INVENTION

1. Field of the Invention

The invention relates to a driving circuit; in particular, to a driving circuit and a switch signal generation method thereof.

2. Description of the Prior Art

When the conventional driving circuit operates at high frequency (for example, the period of the pulse width modulation signal is <5% or the operating frequency is above 1 MHz), it is possible that the state of the logical signal U0/L0 received by the upper/lower bridge driving circuit has been changed due to the RC delay in the driving circuit, but the switch signal UG/LG outputted by the upper/lower bridge driving circuit has not ended.

At this time, if the state of the switch signal UG/LG is also changed with the logical signal U0/L0, the switch signals UG and LG are at the high-level HV simultaneously, so that the upper bridge switch and the lower bridge switch are turned on simultaneously causing the shoot through phenomenon, as shown in FIG. 1.

Especially in the case where the application of high frequency components becomes more and more frequent, this problem is more likely to occur and needs to be overcome.

SUMMARY OF THE INVENTION

Therefore, the invention provides a driving circuit and a switch signal generation method thereof to effectively solve the above-mentioned problems in the prior art.

An embodiment of the invention is a driving circuit. In this embodiment, the driving circuit receives a pulse width modulation signal and provides a first switch signal and a second switch signal. The driving circuit includes a logical signal circuit, a lower bridge dead time circuit and a lower bridge driving circuit. The logical signal circuit is configured to provide a first logical signal and a second logical signal according to the pulse width modulation signal. The lower bridge dead time circuit is coupled to the logical signal circuit. The lower bridge dead time circuit is configured to determine a leading edge of a lower bridge dead time signal according to the first logical signal and determine a trailing edge of the lower bridge dead time signal according to a trailing edge of the first switch signal. The lower bridge driving circuit is coupled to the logical signal circuit and the lower bridge dead time circuit. The lower bridge driving circuit is configured to determine a leading edge of the second switch signal according to the second logical signal and determine a trailing edge of the second switch signal according to the trailing edge of lower bridge dead time signal.

In an embodiment of the invention, the driving circuit further includes an upper bridge dead time circuit. The upper bridge dead time circuit is coupled to the logical signal circuit and configured to determine a leading edge of an upper bridge dead time signal according to the second switch signal and determine a trailing edge of the upper bridge dead time signal according to a trailing edge of second logical signal.

In an embodiment of the invention, the driving circuit further includes an upper bridge driving circuit. The upper bridge driving circuit is coupled to the logical signal circuit and the lower bridge dead time circuit and configured to determine a leading edge of the first switch signal according to the leading edge of the upper bridge dead time signal and determine the trailing edge of the first switch signal according to a trailing edge of the first logical signal.

In an embodiment of the invention, the lower bridge driving circuit includes an AND gate and a driver. The AND gate is coupled to the logical signal circuit and the lower bridge dead time circuit and configured to determine logical states of the second logical signal and the lower bridge dead time signal and then output the logical states. The driver is coupled to the AND gate and configured to generate the second switch signal.

In an embodiment of the invention, the lower bridge dead time circuit includes a delay circuit, a flip-flop and a NOR gate. The delay circuit is configured to receive the first switch signal and provide a delayed first switch signal. The flip-flop is coupled to the logical signal circuit and the delay circuit and configured to receive the second logical signal and the delayed first switch signal and provide an output signal. The NOR gate is coupled to the flip-flop, the delay circuit and the lower bridge driving circuit and configured to receive the output signal and the delayed first switch signal and provide the lower bridge dead time signal to the lower bridge driving circuit.

Another embodiment of the invention is a driving circuit. In this embodiment, the driving circuit receives a pulse width modulation signal and provides a first switch signal and a second switch signal. The driving circuit includes a logical signal circuit, a lower bridge dead time circuit, a lower bridge driving circuit, an upper bridge dead time circuit and an upper bridge driving circuit. The logical signal circuit is configured to provide a first logical signal and a second logical signal according to the pulse width modulation signal. The lower bridge dead time circuit is coupled to the logical signal circuit and configured to determine a leading edge of a lower bridge dead time signal according to the first logical signal and determine a trailing edge of the lower bridge dead time signal according to a trailing edge of the first switch signal. The lower bridge driving circuit is coupled to the logical signal circuit and the lower bridge dead time circuit and configured to determine a leading edge of the second switch signal according to the second logical signal and determine a trailing edge of the second switch signal according to the trailing edge of the lower bridge dead time signal. The upper bridge dead time circuit is coupled to the logical signal circuit and configured to determine a leading edge of an upper bridge dead time signal according to the second switch signal and determine a trailing edge of the upper bridge dead time signal according to a trailing edge of second logical signal. The upper bridge driving circuit is coupled to the logical signal circuit and the lower bridge dead time circuit and configured to determine a leading edge of the first switch signal according to the leading edge of the upper bridge dead time signal and determine the trailing edge of the first switch signal according to a trailing edge of the first logical signal.

Another embodiment of the invention is a switch signal generation method. In this embodiment, the switch signal generation method includes steps of: providing a first logical signal and a second logical signal according to the pulse width modulation signal; determining a leading edge of a lower bridge dead time signal according to the first logical signal and determining a trailing edge of the lower bridge dead time signal according to a trailing edge of the first switch signal; and determining a leading edge of the second switch signal according to the second logical signal and determining a trailing edge of the second switch signal according to the trailing edge of the lower bridge dead time signal.

Compared to the prior art, the driving circuit and the switch signal generation method of the invention confirm the logical signal of the other phase during the dead time period before the switch signal of one phase changes, and end the dead time period when the switch signal of the other phase is confirmed to be in the off-state. Therefore, it ensures that the upper bridge switch and the lower bridge switch are not turned on simultaneously to effectively avoid the shoot through phenomenon in which the upper bridge switch and the lower bridge switch are turned on simultaneously in the high frequency application.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
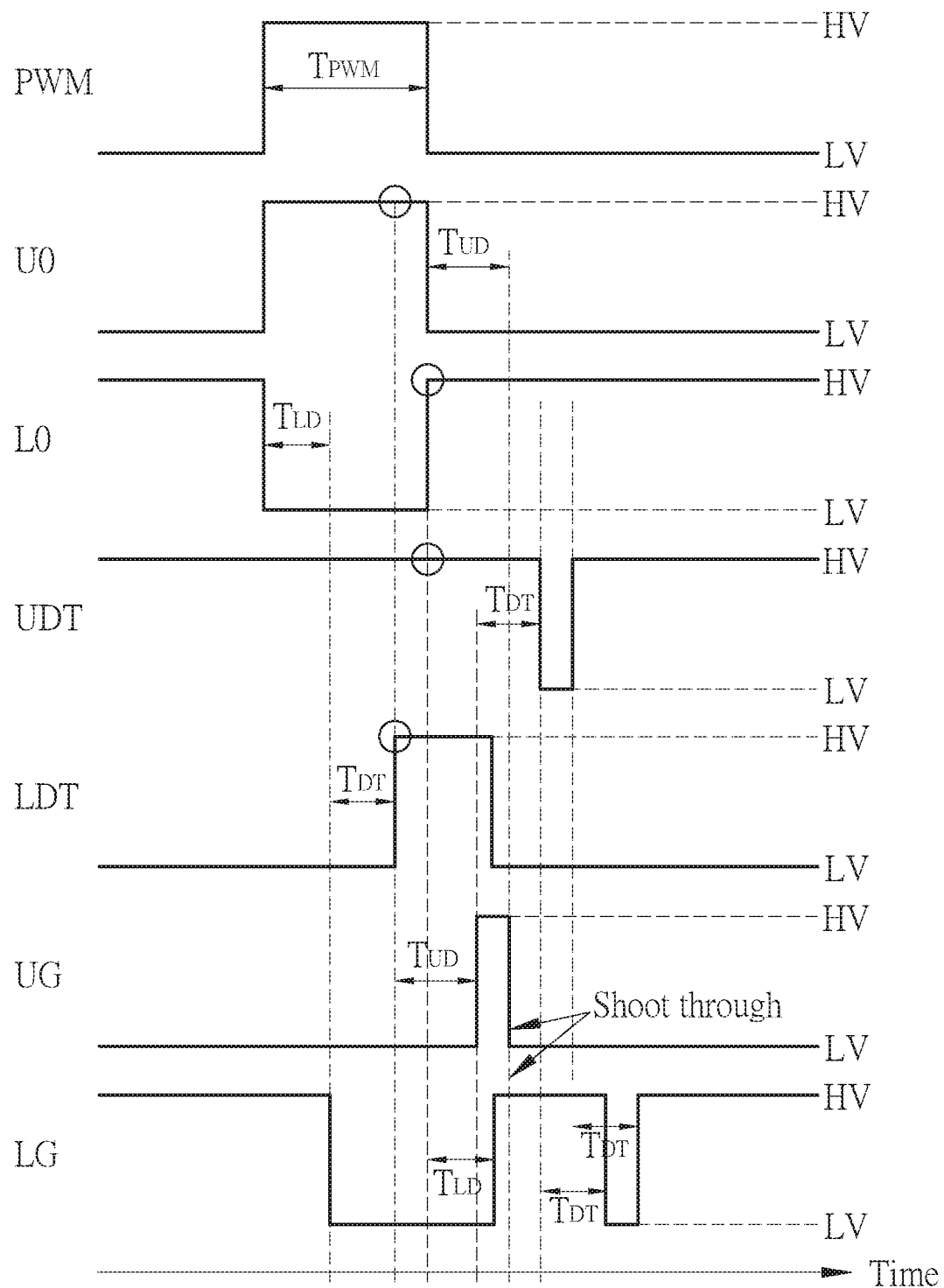
FIG. 1 illustrates a timing diagram of the conventional drive circuit exhibiting a through-through phenomenon under the high frequency operation.

Exemplary embodiments of the invention are referenced in detail now, and examples of the exemplary embodiments are illustrated in the drawings. Further, the same or similar reference numerals of the elements/components in the drawings and the detailed description of the invention are used on behalf of the same or similar parts.

A preferred embodiment of the invention is a drive circuit. In this embodiment, the driving circuit can be applied to a power converter for generating a first switch signal and a second switch signal to an upper bridge switch and a lower bridge switch in an output stage according to a pulse width modulation (PWM) signal respectively, but not limited to this.

Figure 2:
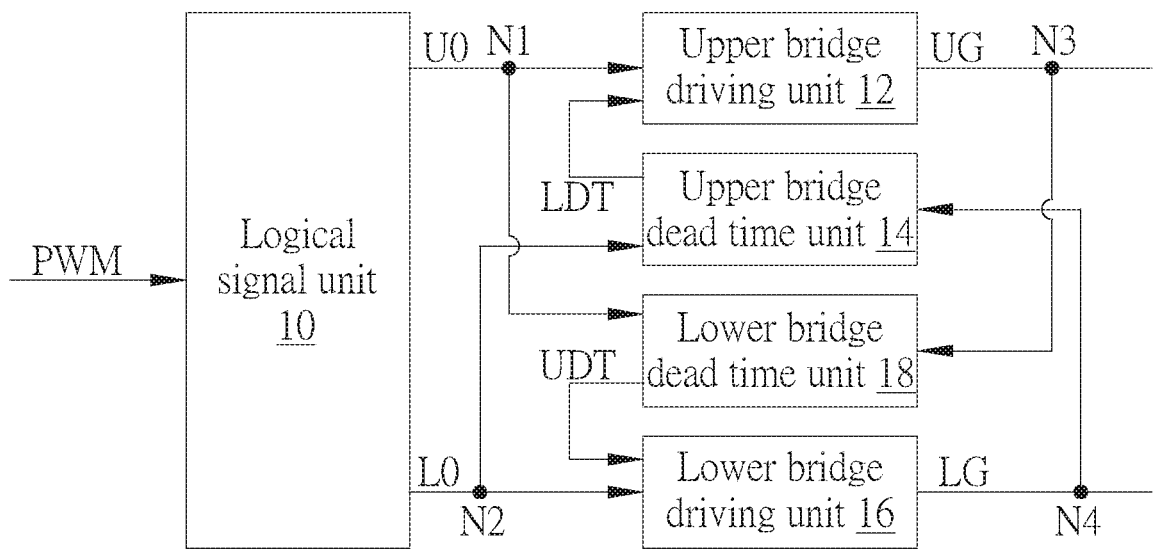
FIG. 2 illustrates a schematic diagram of the driving circuit in a preferred embodiment of the invention.

Please refer to FIG. 2. FIG. 2 illustrates a schematic diagram of the driving circuit in this embodiment. As shown in FIG. 2, the driving circuit 1 receives the pulse width modulation signal PWM and provides a first switch signal UG and a second switch signal LG respectively.

The drive circuit 1 includes a logical signal circuit 10, an upper bridge driving circuit 12, an upper bridge dead time circuit 14, a lower bridge driving circuit 16 and a lower bridge dead time circuit 18. The logical signal circuit 10 is coupled to the upper bridge driving circuit 12, the upper bridge dead time circuit 14, the lower bridge driving circuit 16 and the lower bridge dead time circuit 18 respectively; the upper bridge driving circuit 12 is coupled to the logical signal circuit 10 and the upper bridge dead time circuit 14 respectively; the upper bridge dead time circuit 14 is coupled to the logical signal circuit 10 and the upper bridge driving circuit 12; the lower bridge driving circuit 16 is coupled to the logical signal circuit 10 and the lower bridge dead time circuit 18 respectively; the lower bridge dead time circuit 18 is coupled to the logical signal circuit 10 and the lower bridge driving circuit 16 respectively.

The logical signal circuit 10 receives the pulse width modulation signal PWM and provides a first logical signal U0 and a second logical signal L0 according to the pulse width modulation signal PWM. In detail, the logical signal circuit 10 provides the first logical signal U0 to the upper bridge driving circuit 12 and the lower bridge dead time circuit 18 respectively, and the logical signal circuit 10 provides the second logical signal L0 to the upper bridge dead time circuit 14 and the lower bridge driving circuit 16 respectively.

Next, the lower bridge driving circuit 16 and the lower bridge dead time circuit 18 will be described as an example as follows.

The lower bridge dead time circuit 18 is coupled to a first node N1 located between the logical signal circuit 10 and the upper bridge driving circuit 12 and a third node N3 at an output terminal of the upper bridge driving circuit 12 respectively to receive the first logical signal U0 and the first switch signal UG respectively.

When the lower bridge dead time circuit 18 receives the first logical signal U0 and the first switch signal UG, the lower bridge dead time circuit 18 will determine a leading edge of a lower bridge dead time signal UDT provided to the bridge driving circuit 16 by the lower bridge dead time circuit 18 according to the first logical signal U0, and the lower bridge dead time circuit 18 will also determine a trailing edge of the lower bridge dead time signal UDT according to a trailing edge of the first switch signal UG.

When the lower bridge driving circuit 16 receives the second logical signal L0 and the lower bridge dead time signal UDT, the lower bridge driving circuit 16 will determine a leading edge of the second switch signal LG outputted by the lower bridge driving circuit 16 according to the second logical signal L0, and the lower bridge driving circuit 16 will also determine a trailing edge of the second switch signal LG according to the trailing edge of the lower bridge dead time signal UDT.

By doing so, during the dead time before the state of the second switch signal LG is changed, the dead time of the second switch signal LG is ended after the first switch signal UG is confirmed to be in the off-state according to the first logical signal U0 and the first switch signal UG. Therefore, when the lower bridge switch is turned on by the second switch signal LG, the upper bridge switch is prevented from being turned on by the first switch signal UG to effectively avoid the shoot through phenomenon caused by the upper bridge switch and the lower bridge switch which are turned on simultaneously.

Similarly, for the upper bridge driving circuit 12 and the upper bridge dead time circuit 14, the upper bridge dead time circuit 14 is coupled to a second node N2 located between the logical signal circuit 10 and the lower bridge driving circuit 16 and a fourth node N4 at an output terminal of the lower bridge driving circuit 16 respectively to receive the second logical signal L0 and the second switch signal LG respectively.

When the upper bridge dead time circuit 14 receives the second logical signal L0 and the second switch signal LG, the upper bridge dead time circuit 14 will determine a leading edge of the lower bridge dead time signal LDT according to the second switch signal LG, and the upper bridge dead time circuit 14 will also determine a trailing edge of the upper bridge dead time signal LDT according to a trailing edge of the second logical signal L0.

When the upper bridge driving circuit 12 receives the first logical signal U0 and the upper bridge dead time signal LDT, the upper bridge driving circuit 12 will determine a leading edge of the first switch signal UG according to a leading edge of the upper bridge dead time signal LDT, and the upper bridge driving circuit 12 will also determine a trailing edge of the first switch signal UG according to the trailing edge of the first logical signal U0.

By doing so, during the dead time before the state of the first switch signal UG is changed, the dead time of the first switch signal UG is ended after the second switch signal LG is confirmed to be in the off-state according to the second logical signal L0 and the second switch signal LG. Therefore, when the upper bridge switch is turned on by the first switch signal UG, the lower bridge switch is prevented from being turned on by the second switch signal LG to effectively avoid the shoot through phenomenon caused by the upper bridge switch and the lower bridge switch which are turned on simultaneously.

Figure 3A:
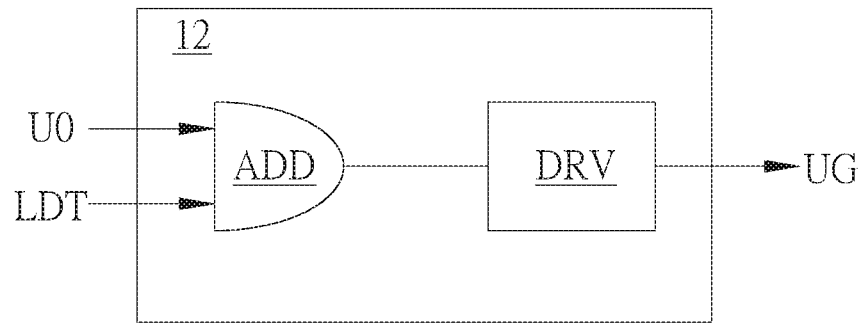
FIG. 3A and FIG. 3B illustrate an embodiment of the upper bridge driving circuit and the upper bridge dead time circuit of FIG. 2.

Please refer to FIG. 3A. In an embodiment, the upper bridge driving circuit 12 includes a AND gate ADD and a driver DRV, but not limited to this. The AND gate ADD is coupled to the logical signal circuit 10 and the upper bridge dead time circuit 14. The AND gate ADD receives the first logical signal U0 and the upper bridge dead time signal LDT respectively and determines logical states of the first logical signal U0 and the upper bridge dead time signal LDT and outputs the logical states to the driver DRV. Then, the driver DRV will generate the first switch signal UG accordingly and output the first switch signal UG.

Figure 3B:
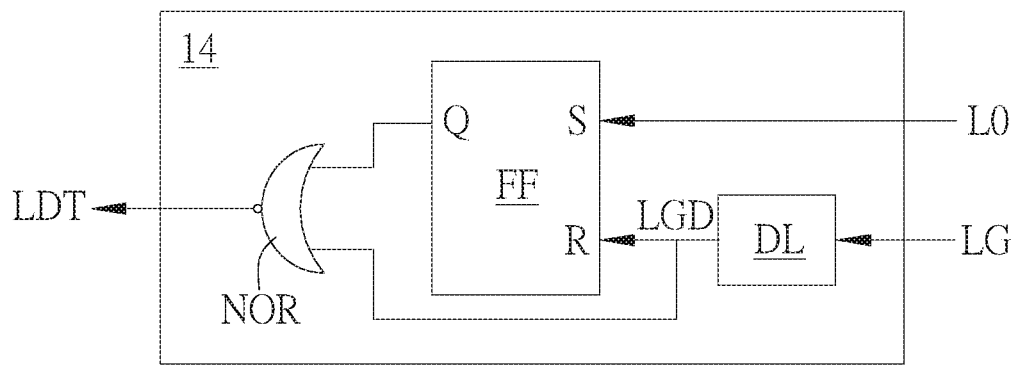

Please refer to FIG. 3B. In an embodiment, the upper bridge dead time circuit 14 includes a delay circuit DL, a flip-flop FF and an NOR gate NOR, but not limited to this. The delay circuit DL is configured to receive the second switch signal LG and delay the second switch signal LG for a period of time to provide a delayed second switch signal LGD. The flip-flop FF is coupled to the logical signal circuit 10 and the delay circuit DL, and two input terminals S and R of the flip-flop FF receive the second logical signal L0 and the delayed second switch signal LGD respectively and an output terminal Q of the flip-flop FF provides an output signal to the NOR gate NOR. Then, the NOR gate NOR generates the upper bridge dead time signal LDT to the upper bridge driving circuit 12 according to the output signal of the flip-flop FF and the delayed second switch signal LGD.

Figure 4A:
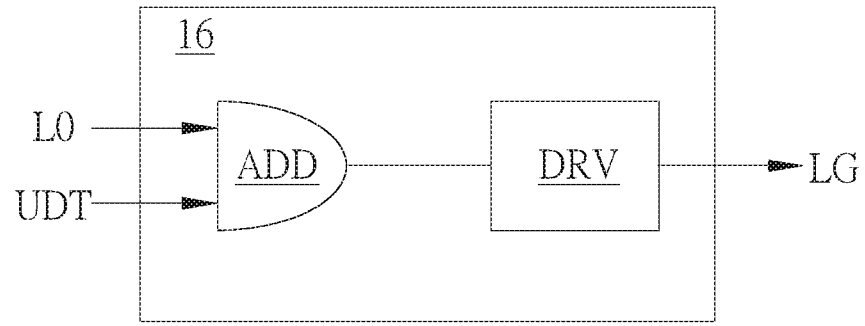
FIG. 4A and FIG. 4B illustrate an embodiment of the lower bridge driving circuit and the lower bridge dead time circuit of FIG. 2.

Please refer to FIG. 4A. In an embodiment, the lower bridge driving circuit 16 includes a AND gate ADD and a driver DRV, but not limited to this. The AND gate ADD is coupled to the logical signal circuit 10 and the lower bridge dead time circuit 18 respectively. When the AND gate ADD receives the second logical signal L0 and the lower bridge dead time signal UDT, the AND gate ADD will add the second logical signal L0 and the lower bridge dead time signal UDT and then output to the driver DRV. Then, the driver DRV will generate the second switch signal LG accordingly and output the second switch signal LG.

Figure 4B:
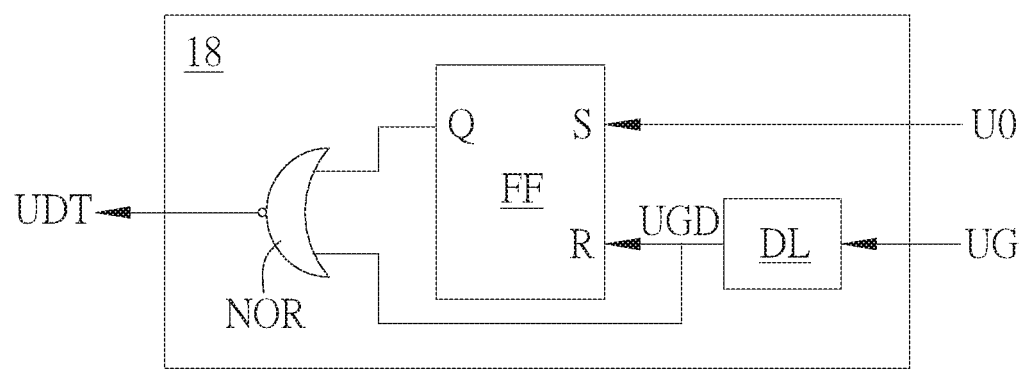

Please refer to FIG. 4B. In an embodiment, the lower bridge dead time circuit 18 includes a delay circuit DL, a flip-flop FF and an NOR gate NOR, but not limited to this. The delay circuit DL is configured to receive the first switch signal UG and delay the first switch signal UG for a period of time to provide a delayed first switch signal UGD. The flip-flop FF is coupled to the logical signal circuit 10 and the delay circuit DL, and the two input terminals S and R of the flip-flop FF receive the first logical signal U0 and the delayed first switch signal UGD respectively and the output terminal Q of the flip-flop FF provides the output signal to the NOR gate NOR. Then, the NOR gate NOR provides the lower bridge dead time signal UDT to the lower bridge driving circuit 16 according to the output signal of the flip-flop FF and the delayed first switch signal UGD.

Figure 5:
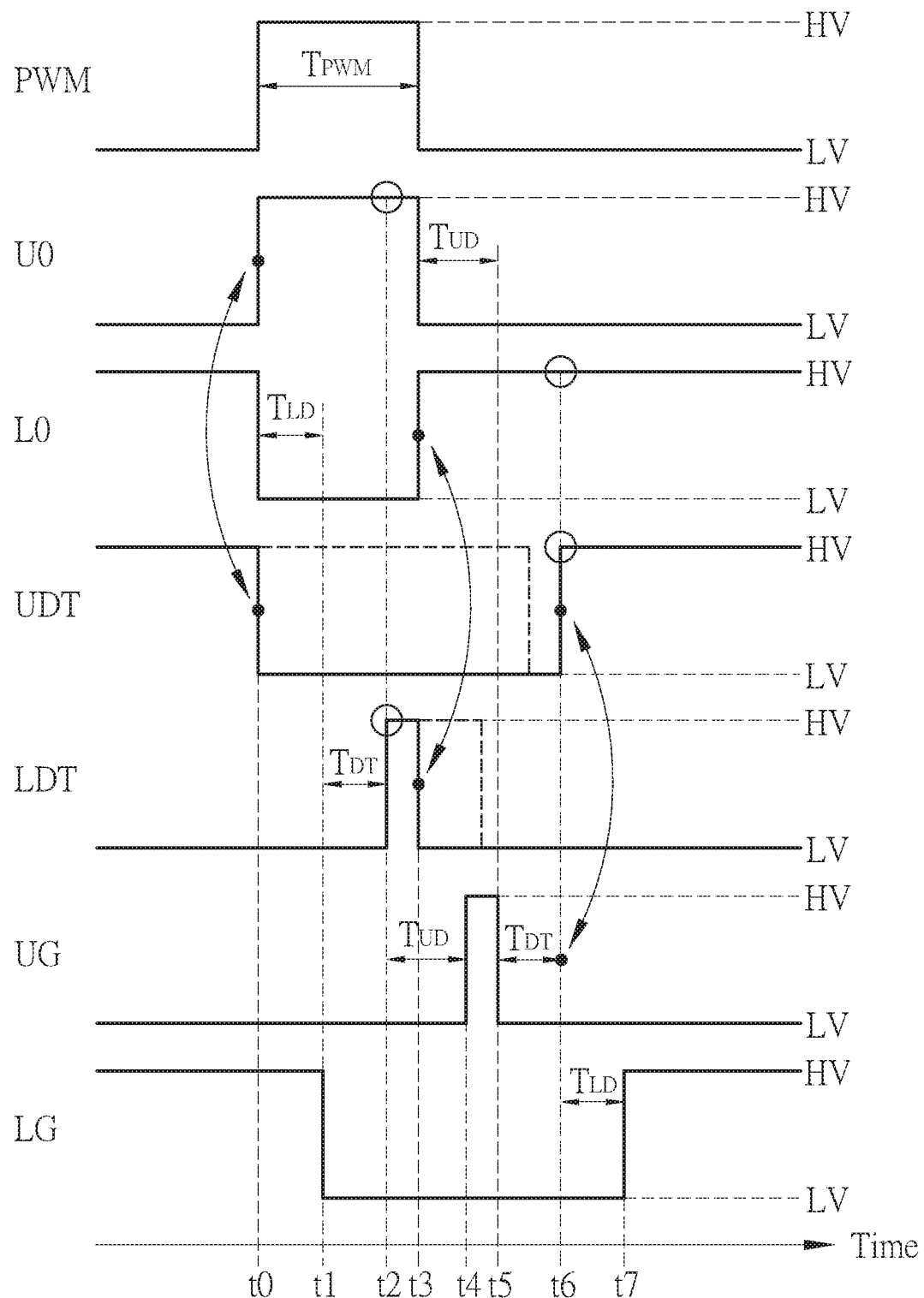
FIG. 5 illustrates a timing diagram of the signals of the driving circuit effectively avoiding the shoot through phenomenon under the high frequency operation in the invention.

Please refer to FIG. 5. FIG. 5 illustrates a timing diagram of the signals of the driving circuit effectively avoiding the shoot through phenomenon under the high frequency operation in the invention. As shown in FIG. 5, the logical signal circuit 10 provides the first logical signal U0 and the second logical signal L0 according to the pulse width modulation signal PWM. Under the high frequency operation, the period $T_{PWM}$ of the pulse width modulation signal PWM is less than 5 us. The phase of the first logical signal U0 is the same with the phase of the pulse width modulation signal PWM. The phase of the second logical signal L0 is opposite to the phase of the pulse width modulation signal PWM. That is to say, the period of the first logical signal U0 and the period of the second logical signal L0 are the same with the period of the pulse width modulation signal PWM.

At the time t0, the pulse width modulation signal PWM changes from a low-level LV to a high-level HV. Therefore, the first logical signal U0 in phase with the pulse width modulation signal PWM also changes from the low-level LV to the high-level HV, and the second logical signal L0 opposite to the pulse width modulation signal PWM changes from the high-level HV to the low-level LV. At this time, the lower bridge dead time circuit 18 will determine the leading edge of the lower bridge dead time signal UDT according to the first logical signal U0, so that the lower bridge dead time signal UDT will change from the high-level HV to the low-level LV at the time t0. The upper bridge dead time signal LDT and the first switch signal UG are maintained at the low-level LV at the time t0 and the second switch signal LG is maintained at the high-level HV at the time t0.

After the delay time $T_{LD}$ of the lower bridge driving circuit 16, at the time t1, the lower bridge driving circuit 16 determines the leading edge of the second switch signal LG outputted by the lower bridge driving circuit 16 according to the second logical signal L0, so that the second switch signal LG changes from the high-level HV to the low-level LV and enters the dead time $T_{DT}$ at the time t1. As for the upper bridge dead time signal LDT, the lower bridge dead time signal UDT and the first switch signal UG, they all maintain the low-level LV at the time t1.

At the time t2, the upper bridge dead time circuit 14 determines the leading edge of the upper bridge dead time signal LDT according to the second switch signal L0 through the dead time $T_{DT}$. In detail, the leading edge of the upper bridge dead time signal LDT is determined according to the second switch signal LG and the dead time $T_{DT}$, so that the upper bridge dead time signal LDT changes from the low-level LV to the high-level HV at the time t2.

At the time t3, the pulse width modulation signal PWM changes from the high-level HV to the low-level LV. Therefore, the first logical signal U0 in phase with the pulse width modulation signal PWM also changes from the high-level HV to the low-level LV, and the second logical signal L0 opposite to the pulse width modulation signal PWM changes from the low-level LV to the high-level HV. The upper bridge dead time circuit 14 determines the trailing edge of the upper bridge dead time signal LDT according to the trailing edge of the second logical signal L0, so that the upper bridge dead time signal LDT changes from the high-level HV to the low-level LV at the time t3.

At the time t4, the upper bridge driving circuit 12 determines the leading edge of the first switch signal UG according to the upper bridge dead time signal LDT. In detail, the leading edge of the first switch signal UG is determined according to the first logical signal U0, the delay time $T_{LD}$, the dead time $T_{DT}$ and the delay time $T_{UD}$, so that the first switch signal UG changes from the low-level LV to the high-level HV at the time t4.

At the time t5, the upper bridge driving circuit 12 determines the trailing edge of the first switch signal UG according to the trailing edge of the upper bridge dead time LDT. In detail, the trailing edge of the first switch signal UG is determined according to the trailing edge of the first logical signal U0 and the delay time $T_{UD}$ of the upper bridge driving circuit 12, so that the first switch signal UG changes from the high-level HV to the low-level LV at the time t5.

At the time t6, the lower bridge dead time circuit 18 determines the trailing edge of the lower bridge dead time signal UDT according to the trailing edge of the first switch signal UG. In detail, the trailing edge of the lower bridge dead time signal UDT is determined according to the trailing edge of the first switch signal UG and the dead time $T_{DT}$, so that the lower bridge dead time signal UDT changes from the low-level LV to the high-level HV at the time t6.

At the time t7, the lower bridge driving circuit 16 determines the trailing edge of the second switch signal LG according to the trailing edge of the lower bridge dead time signal UDT. In detail, the trailing edge of the second switch signal LG is determined according to the trailing edge of the lower bridge dead time signal UDT and the delay time $T_{LD}$ of the lower bridge driving circuit 16, so that the lower bridge dead time signal UDT changes from the low-level LV to the high-level HV at the time t6.

According to the above description, the following two conclusions can be obtained:

(1) Since the first switch signal UG is maintained at the low-level LV for the period from the time t0 to the time t4 and the period from the time t5 to the time t7, that is to say, the upper bridge switch is controlled by the first switch signal UG to be in the off-state during the period from the time t0 to the time t4 and the period from the time t5 to the time t7. Therefore, even if the second switch signal LG changes to the high-level HV during the period from the time t0 to the time t4 and the period from the time t5 to the time t7; that is to say, the lower bridge switch is controlled by the second switch signal LG to be in the on-state during the period from the time t0 to the time t4 and the period from the time t5 to the time t7. Since it is impossible for the first switch signal UG and the second switch signal LG to be the high-level HV at the same time, so that the shoot through phenomenon caused by the upper bridge switch and the lower bridge switch simultaneously turned on does not occur.

(2) Since the first switch signal UG is maintained at the high-level HV during the period from the time t4 to the time t5, that is to say, the upper bridge switch is controlled by the first switch signal UG to be in the on-state during the period from the time t4 to the time t5, and the second switch signal LG is maintained in the low-level LV during the period from the time t4 to the time t5, that is to say, the lower bridge switch is controlled by the second switch signal LG to be in the off-state during the period from the time t4 to the time t5. Therefore, when the upper bridge switch is in the on-state during the period from the time t4 to the time t5, the lower bridge switch is in the off-state; the shoot through phenomenon in which the upper bridge switch and the lower bridge switch are turned on simultaneously cannot occur.

Therefore, even if the driving circuit of the invention is operated at high frequency, the shoot through phenomenon in which the upper bridge switch and the lower bridge switch are turned on simultaneously is unlikely to occur during the period from the time t0 to the time t7, so that the shoot through phenomenon can be effectively avoided in the high frequency applications.

Figure 6:
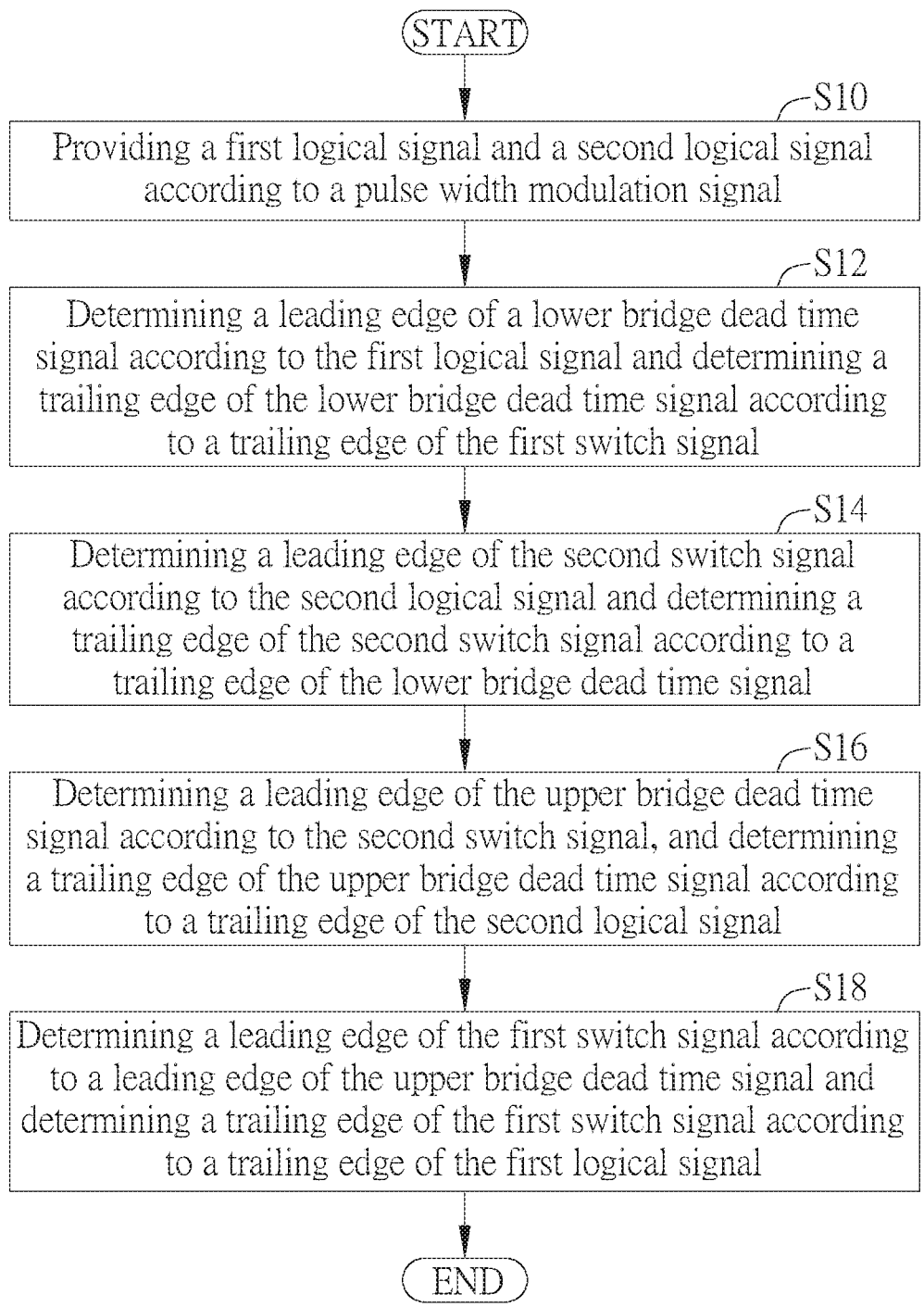
FIG. 6 illustrates a flowchart of the switch signal generation method in another preferred embodiment of the invention.

Another preferred embodiment of the invention is a switch signal generation method. Please refer to FIG. 6. FIG. 6 illustrates a flowchart showing the switch signal generation method in this embodiment.

As shown in FIG. 6, the switch signal generation method includes the following steps:

Step S10: providing a first logical signal and a second logical signal according to a pulse width modulation signal;

Step S12: determining a leading edge of a lower bridge dead time signal according to the first logical signal and determining a trailing edge of the lower bridge dead time signal according to a trailing edge of the first switch signal;

Step S14: determining a leading edge of the second switch signal according to the second logical signal and determining a trailing edge of the second switch signal according to a trailing edge of the lower bridge dead time signal;

Step S16: determining a leading edge of the upper bridge dead time signal according to the second switch signal, and determining a trailing edge of the upper bridge dead time signal according to a trailing edge of the second logical signal;

Step S18: determining a leading edge of the first switch signal according to a leading edge of the upper bridge dead time signal and determining a trailing edge of the first switch signal according to a trailing edge of the first logical signal.

Compared to the prior art, the driving circuit and the switch signal generation method of the invention confirm the logical signal of the other phase during the dead time period before the switch signal of one phase changes, and end the dead time period when the switch signal of the other phase is confirmed to be in the off-state. Therefore, it ensures that the upper bridge switch and the lower bridge switch are not turned on simultaneously to effectively avoid the shoot through phenomenon in which the upper bridge switch and the lower bridge switch are turned on simultaneously in the high frequency application.

What is claimed is:

1. A driving circuit, receiving a pulse width modulation signal and providing a first switch signal and a second switch signal, the driving circuit comprising:
a logical signal circuit, configured to provide a first logical signal and a second logical signal according to the pulse width modulation signal;
a lower bridge dead time circuit, coupled to the logical signal circuit and configured to determine a leading edge of a lower bridge dead time signal according to the first logical signal and determine a trailing edge of the lower bridge dead time signal according to a trailing edge of the first switch signal; and a lower bridge driving circuit, coupled to the logical signal circuit and the lower bridge dead time circuit and configured to determine a leading edge of the second switch signal according to the second logical signal and determine a trailing edge of the second switch signal according to the trailing edge of the lower bridge dead time signal.

2. The driving circuit of claim 1, further comprising:
an upper bridge dead time circuit, coupled to the logical signal circuit and configured to determine a leading edge of an upper bridge dead time signal according to the second switch signal and determine a trailing edge of the upper bridge dead time signal according to a trailing edge of second logical signal.

3. The driving circuit of claim 2, further comprising:
an upper bridge driving circuit, coupled to the logical signal circuit and the lower bridge dead time circuit and configured to determine a leading edge of the first switch signal according to the leading edge of the upper bridge dead time signal and determine the trailing edge of the first switch signal according to a trailing edge of the first logical signal.

4. The driving circuit of claim 1, wherein the lower bridge driving circuit comprises:
an AND gate, coupled to the logical signal circuit and the lower bridge dead time circuit and configured to determine logical states of the second logical signal and the lower bridge dead time signal and then output the logical states; and
a driver, coupled to the AND gate and configured to generate the second switch signal.

5. The driving circuit of claim 1, wherein the lower bridge dead time circuit comprises:
a delay circuit, configured to receive the first switch signal and provide a delayed first switch signal;
a flip-flop, coupled to the logical signal circuit and the delay circuit and configured to receive the first logical signal and the delayed first switch signal and provide an output signal; and
a NOR gate, coupled to the flip-flop, the delay circuit and the lower bridge driving circuit and configured to receive the output signal and the delayed first switch signal and provide the lower bridge dead time signal to the lower bridge driving circuit.

6. The driving circuit of claim 1, wherein phases of the first logical signal and the second logical signal are opposite.

7. A driving circuit, receiving a pulse width modulation signal and providing a first switch signal and a second switch signal, the driving circuit comprising:
a logical signal circuit, configured to provide a first logical signal and a second logical signal according to the pulse width modulation signal;
a lower bridge dead time circuit, coupled to the logical signal circuit and configured to determine a leading edge of a lower bridge dead time signal according to the first logical signal and determine a trailing edge of the lower bridge dead time signal according to a trailing edge of the first switch signal;
a lower bridge driving circuit, coupled to the logical signal circuit and the lower bridge dead time circuit and configured to determine a leading edge of the second switch signal according to the second logical signal and determine a trailing edge of the second switch signal according to the trailing edge of the lower bridge dead time signal;
an upper bridge dead time circuit, coupled to the logical signal circuit and configured to determine a leading edge of an upper bridge dead time signal according to the second switch signal and determine a trailing edge of the upper bridge dead time signal according to a trailing edge of second logical signal; and
an upper bridge driving circuit, coupled to the logical signal circuit and the lower bridge dead time circuit and configured to determine a leading edge of the first switch signal according to the leading edge of the upper bridge dead time signal and determine the trailing edge of the first switch signal according to a trailing edge of the first logical signal.

8. A switch signal generation method, applied to a driving circuit receiving a pulse width modulation signal and providing a first switch signal and a second switch signal, the switch signal generation method comprising steps of:
providing a first logical signal and a second logical signal according to the pulse width modulation signal;
determining a leading edge of a lower bridge dead time signal according to the first logical signal and determining a trailing edge of the lower bridge dead time signal according to a trailing edge of the first switch signal; and
determining a leading edge of the second switch signal according to the second logical signal and determining a trailing edge of the second switch signal according to the trailing edge of the lower bridge dead time signal.

9. The switch signal generation method of claim 8, further comprising steps of:
determining a leading edge of an upper bridge dead time signal according to the second switch signal and determining a trailing edge of the upper bridge dead time signal according to a trailing edge of second logical signal; and
determining a leading edge of the first switch signal according to the leading edge of the upper bridge dead time signal and determining the trailing edge of the first switch signal according to a trailing edge of the first logical signal.

* * * * *